United States Patent

Yoshinaga

Patent Number: 5,895,706
Date of Patent: Apr. 20, 1999

[54] EPITAXIAL STRUCTURE FOR GAP LIGHT-EMITTING DIODE

[75] Inventor: Atsushi Yoshinaga, Chichibu, Japan

[73] Assignee: Showa Denko K.K., Tokyo, Japan

[21] Appl. No.: 08/843,961

[22] Filed: Apr. 17, 1997

Related U.S. Application Data

[63] Continuation of application No. 08/541,681, Oct. 10, 1995, abandoned.

[30] Foreign Application Priority Data

Mar. 17, 1995 [JP] Japan ................................ 7-059131

[51] Int. Cl.$^6$ ........................................... H05B 33/00
[52] U.S. Cl. ........................... 428/212; 428/690; 428/700; 428/917; 257/101; 257/103; 117/955; 313/498; 313/503; 313/506
[58] Field of Search .................. 117/17, 21, 955; 428/688, 701, 702, 917, 212, 690, 700; 437/127; 257/190, 101, 103; 313/498, 503, 506; 438/46

[56] References Cited

U.S. PATENT DOCUMENTS

| | | | |
|---|---|---|---|
| 4,303,464 | 12/1981 | Suzuki | 117/17 |
| 4,671,829 | 6/1987 | Kawabata et al. | |
| 5,019,874 | 5/1991 | Inoue | 257/190 |
| 5,032,539 | 7/1991 | Watanabe | 437/127 |
| 5,219,632 | 6/1993 | Shimakura | 428/688 |
| 5,571,321 | 11/1996 | Yanagisawa et al. | |

FOREIGN PATENT DOCUMENTS

| | | |
|---|---|---|
| 05 90 649 A1 | 4/1994 | European Pat. Off. |
| 0 631 330 A2 | 12/1994 | European Pat. Off. |
| 41 00 668 A1 | 7/1991 | Germany |
| 62-86773 | 4/1987 | Japan |
| 2-18319 | 4/1990 | Japan |

OTHER PUBLICATIONS

"Correlation between Dislocation Pits in GaP LPE Layers and LEC Substrates", Tatsuro Beppu et al.; Japanese Journal of Applied Physics, vol. 17, No. 3, Mar. 1978; pp. 509–513—Toshiba Research & Development Ctr., Tokyo Shibaura Electric Co., Ltd. Kawasaki.

Etch Pit Studies of GaP Liquid Phase Epitaxial Layers; G.A. Rozonyi and T. Iizuka Japanese Electrochemical Society, May 1973, pp. 673–678—Bell Laboratories, Murray Hill, NJ 07974.

*Primary Examiner*—Marie Yamnitzky
*Attorney, Agent, or Firm*—Armstrong, Westerman, Hattori, McLeland & Naughton

[57] ABSTRACT

An epitaxial structure for a GaP light-emitting diode comprises an n-type GaP single crystal substrate on which is formed a plural buffer layer epitaxially grown on the single crystal substrate, in which the buffer layer has a lower etch pit density than the etch pit density of the single crystal substrate, etch pit density decreases with each upper layer, and a GaP active layer is formed on the buffer layer.

6 Claims, 4 Drawing Sheets

1

EPITAXIAL STRUCTURE FOR GAP LIGHT-EMITTING DIODE

This application is a continuation of Ser. No. 08/541,681 filed Oct. 10, 1995, now abandoned.

BACKGROUND OF THE INVENTION

1. Field of the Invention

This invention relates to an epitaxial structure for GaP light-emitting diodes.

2. Description of the Related Art

An epitaxial structure for a light-emitting diode is normally obtained by epitaxially growing a plurality of semiconductor layers on a semiconductor substrate to form a p-n junction. In an epitaxial structure for a green light-emitting diode using gallium phosphide (GaP), an active layer is formed by growing n-conductivity type (hereinafter "n-type") and p-conductivity type (hereinafter "p-type"); GaP layers on an n-type GaP single crystal substrate, and to obtain a high electro-luminescence efficiency, nitrogen is normally used in doping an n-type GaP layer. While the electro-luminescence efficiency of GaP green light-emitting diodes has been improved to some extent by use of a nitrogen dopant, there has been a need for even higher electro-luminescence efficiency levels for applications such as large displays for outdoor use, for example. Not only for epitaxial structures for GaP light-emitting diodes, but for epitaxial structures for light-emitting diodes in general, improving the crystallinity is of key importance for realizing high electro-luminescence efficiency. However, GaP light-emitting diodes, in particular, have an indirect type emission mechanism that results in a low emission efficiency and makes these light-emitting diodes susceptible to the influence of the crystallinity.

A widely used index of crystallinity is the etch pit density (EPD) of the crystal surface. This is an evaluation method that utilizes the pits formed just at crystal defect portions by a specific etching fluid. With respect to GaP, the EPD is obtained as a count of the number of pits per square centimeter of surface formed by an etching method known as Richard & Crocker etching ("RC etching").

FIG. 3 shows the relationship between substrate EPD and the emission efficiency of the LED formed on the substrate. From FIG. 3 it can be seen that the lower the EPD of the substrate, the higher tends to be the emission efficiency of the LED. As such, developing an epitaxial structure for a high electroluminescence efficiency GaP light-emitting diode comes down to developing a substrate having a low EPD.

However, while there are various methods of fabricating a GaP single crystal substrate, in general it is difficult to reduce the EPD. Instead, JP-B-HEI-2-18319, for example, discloses a method for reducing the effect of the EPD. In accordance with the method, in the epitaxial growth system the GaP substrate is contacted with the melt first to form an n-type GaP layer (hereinafter referred to as the "$n_0$ layer") on the GaP substrate by a supercooled growth method. The substrate is then separated from the melt and the temperature of the epitaxial growth system is again elevated, the substrate on which the $n_0$ layer has been grown is contacted with a fresh melt as a starting material and the temperature is further elevated, the $n_0$ layer reverts back to a melt, following which a normal process is used to fabricate a p-n junction by forming another n-layer, (hereinafter referred to as the "$n_1$ layer"), an n-layer in which nitrogen is doped (hereinafter referred to as the "$n_2$ layer") and a p-layer in which zinc is used as a dopant, in a continuous epitaxial growth operation. In this method, the no layer grown in the first half of the process does not contribute directly to light emission. The disclosure teaches that all or part of the $n_0$ layer is melted back to form a fresh melt in the second half of the process. Also, the $n_0$ layer melt and heating program are separated from the epitaxial process used in the latter half to form the p-n junction, and as such, layer thickness and other growth conditions can be set independently. Since the $n_0$ layer is thus an epitaxial layer that comes between the GaP substrate and the latter half epitaxial process, hereinbelow this $n_0$ layer is referred to as a buffer layer.

Inasmuch as the $n_1$ layer grown at the beginning of the latter half of the epitaxial process also does not contribute to the light emission, the $n_1$ layer also corresponds to a buffer layer. However, as in the latter half process, in which the $n_1$ layer is included, growth is by the supercooled growth method, the sum thickness of the epitaxial layers is constant. Thus, unlike the case of the $n_0$ layer, changing the thickness of the $n_1$ layer results in a related change in the thickness of the $n_2$ layer and of the p-layer. Also, the temperature at which growth of the $n_1$ layer is completed becomes the growth starting temperature of the $n_2$ layer, i.e., the active layer. Thus, since $n_1$ layer growth conditions directly affect the $n_2$ layer growth conditions, strictly speaking the $n_1$ layer is differentiated from then $n_0$ layer which is a buffer layer, and constitutes part of the active layer. According to the disclosure, using a method that provides this buffer layer results in an improvement of 0.4% or more in the emission efficiency of the active layer. However, based only on that, it is difficult to realize a GaP light-emitting diode having a high enough electro-luminescence efficiency for outdoor use.

An object of the present invention is to provide an epitaxial structure for a high electroluminescence efficiency GaP light-emitting diode having an improved buffer layer and a decreased EPD on the surface on which the active layer is formed.

SUMMARY OF THE INVENTION

To attain the above object, the present invention provides an epitaxial structure for a GaP light-emitting diode, comprising an n-type GaP single crystal substrate, a plurality of layers epitaxially grown on the single crystal substrate to form a buffer layer in which said plurality of layers has a lower etch pit density than an etch pit density of the single crystal substrate and the etch pit density decreases with each upper layer, and a GaP active layer formed on the buffer layer.

Thus, this invention comprises interposition of the single crystal substrate and the active layer a plural buffer layer having a sequentially decreasing etch pit density. A first buffer layer of a prescribed thickness is epitaxially grown on the single crystal substrate, the melt and substrate are separated, and the next buffer layer is epitaxially grown on the preceding buffer layer. In this way a buffer layer comprised of a plurality of layers is grown on the substrate. The light emitting structure is then grown on the buffer layer. There is therefore a sequential decrease in the propagation of substrate crystal defects in the interface between the substrate and the first buffer layer and between the first buffer layer and a following buffer layer, resulting in formation of a buffer layer surface with an EPD that is reduced from one-third to one-fifth the EPD of the substrate. Growing a GaP light emitting structure on such a surface results in a GaP light-emitting diode having a markedly improved emission efficiency.

The above and other features of the present invention will become apparent from the following description made with reference to the drawings.

DESCRIPTION OF THE PREFERRED EMBODIMENT

Figure 4:
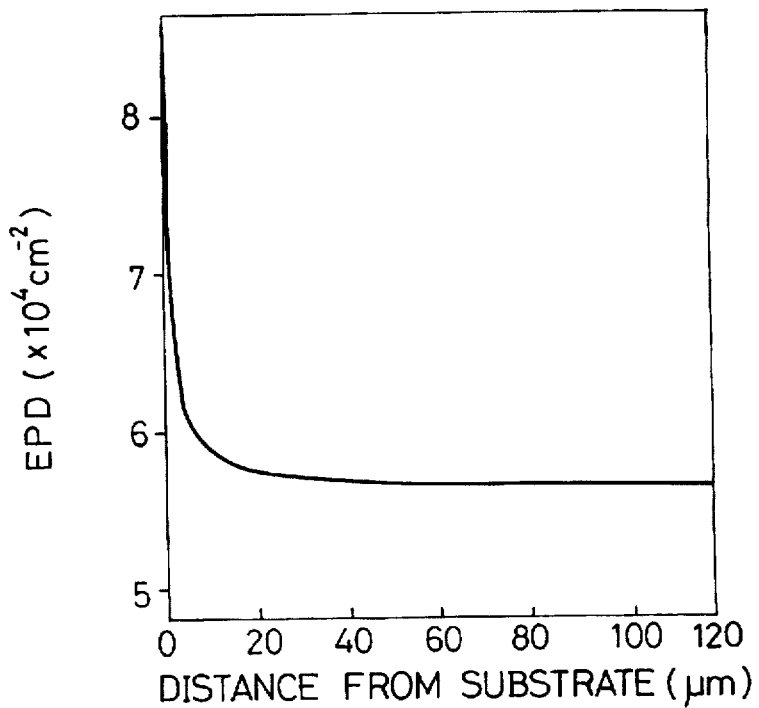
FIG. 4 shows a profile of the EPD in a buffer layer of a GaP light-emitting diode.

For a detailed investigation into the effect of a buffer layer in an epitaxial structure for a GaP light-emitting diode produced by the above-described method in which the EPD is decreased, the present inventors measured changes in the EPD of a buffer layer that is gradually reduced in thickness. The results are shown in FIG. 4, from which it can be seen that there was a sharp decrease in the EPD at the interface between an epitaxially formed buffer layer and substrate, while there was almost no reduction in the EPD inside the buffer layer.

Figure 5:
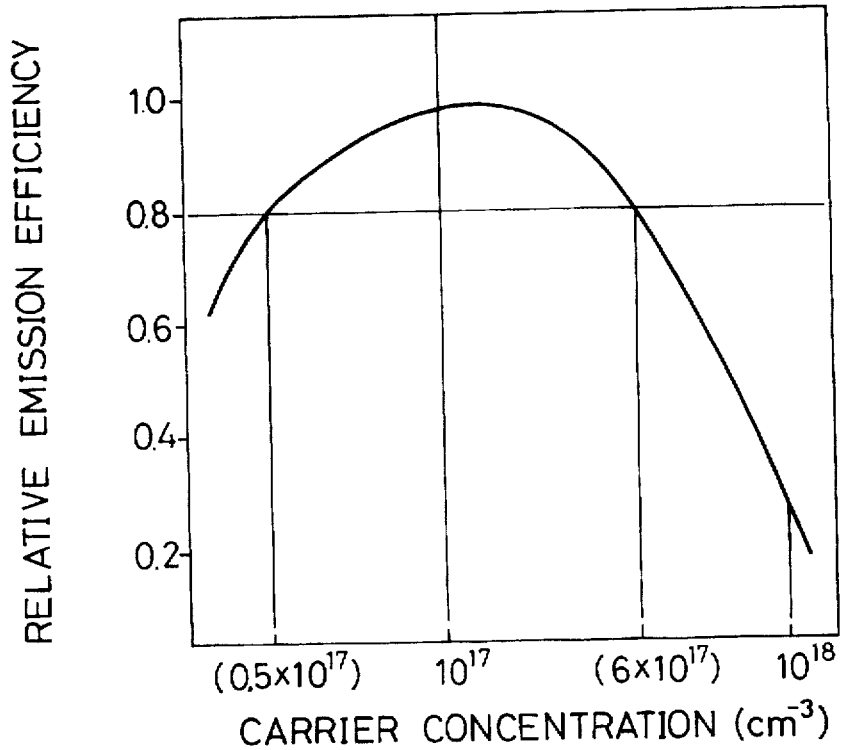
FIG. 5 shows the relationship between emission efficiency and the carrier concentration in the buffer layer of a GaP light-emitting diode.

The relationship between carrier concentration of the buffer layer and the emission efficiency of a light-emitting diode provided with the buffer layer was then investigated. For the purpose of this investigation, Si was used as the buffer layer dopant, and the buffer layer was grown by the liquid-phase epitaxial growing method. The buffer layer thickness was approximately 100 μm. The standard liquid-phase epitaxial growth method was used to grow a light emitting structure on a substrate provided with the buffer layer. As shown in FIG. 5, the maximum value of the emission efficiency was 0.8 or above at a buffer layer carrier concentration range of from $0.5 \times 10^{17}$ cm$^{-3}$ to $6 \times 10^{17}$ cm$^{-3}$.

Figure 3:
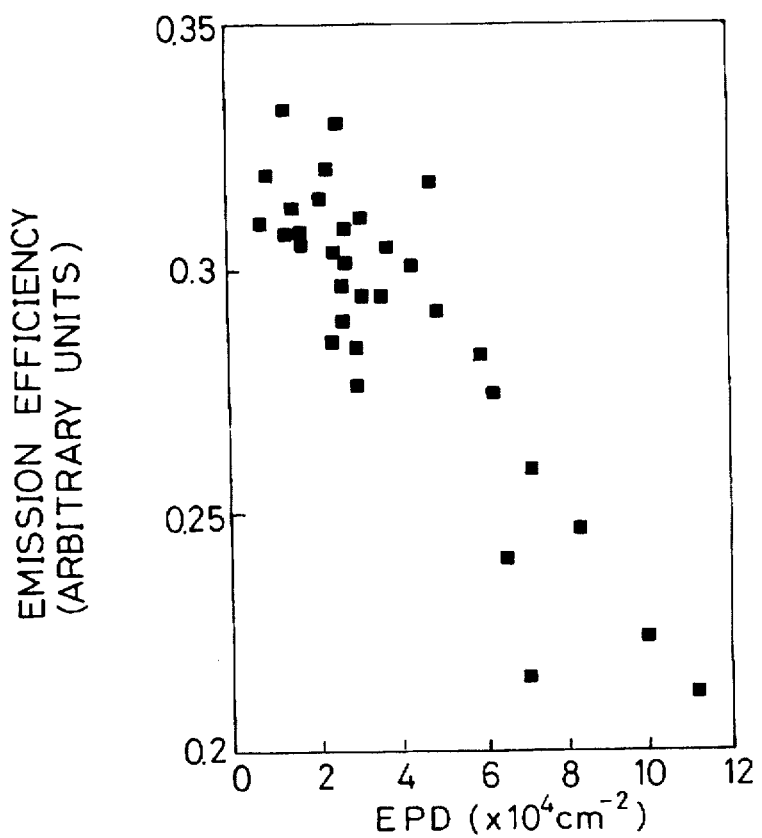
FIG. 3 shows the relationship between substrate EPD and the emission efficiency of the light emitting structure grown on the substrate.
Figure 6:
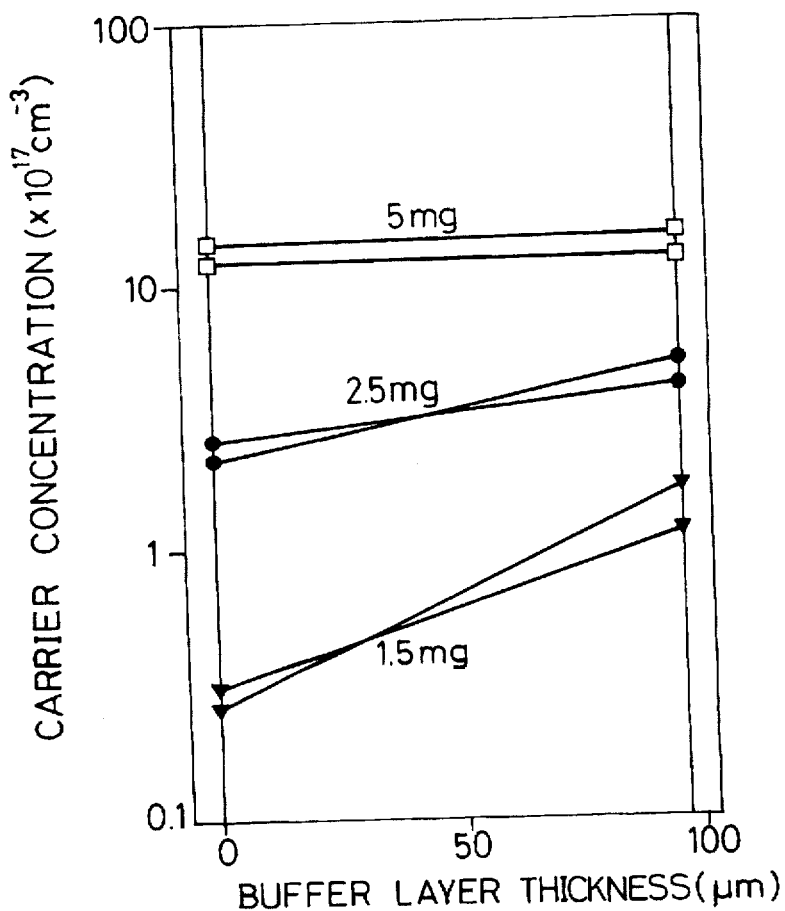
FIG. 6 shows the relationship between the amount of Si dopant and the buffer layer carrier concentration profile of a GaP light-emitting diode.

Taking into consideration the fact that there is a negative correlation between the substrate EPD of FIG. 3 and the emission efficiency of the active layer grown on that substrate, the results of FIG. 5 signify not that the EPD decreases when there is a decrease in the carrier concentration of the buffer layer, but that the EPD of the buffer layer region has the minimum value relative to the carrier concentration of the buffer layer region. In general, it is understandable that a rise in the carrier concentration is accompanied by a degradation in the crystallinity and an increase in the EPD. However, this alone cannot explain why the EPD increases when the carrier concentration is lower than the optimum value. The present inventor therefore measured the carrier concentration profiles in the buffer layer when the amount of the Si dopant charged in the melt is changed during the buffer layer growing process. The distribution coefficient of the Si in the GaP increased as the growth temperature decreased, that is, with the progress of the epitaxial growth. As a result, the progress of the growth is accompanied by a buffer layer carrier concentration that rises towards the surface. The degree of the increase is affected by the amount of the added Si dopant, showing a larger rate of increase (i.e., the steeper slopes of FIG. 6) with the drop in carrier concentration at the start of growth of the buffer layer, as shown by FIG. 6. In FIG. 6, the symbol ▼ indicates, in the case of 1.5 mg of added Si per 100 g of Ga, a carrier concentration of approximately $0.4 \times 10^{17}$ cm$^{-3}$ directly after the start of epitaxial growth, and a carrier concentration of approximately $1 \times 10^{17}$ cm$^{-3}$ in the vicinity of the surface of a buffer layer of about 100 μm. The symbol ● indicates, in the case of 2.5 mg of added Si per 100 g of Ga, a carrier concentration of approximately $1.3 \times 10^{17}$ cm$^{-3}$ at the substrate interface, while the carrier concentration at the surface of the buffer layer is approximately $1.5 \times 10^{-17}$ cm$^{-3}$. The symbol □ indicates, in the case of 5 mg of added Si per 100 g of Ga, a carrier concentration of around $20 \times 10^{17}$ cm$^{-3}$ directly after the start of epitaxial growth, and no change in the carrier concentration even with the progress of the epitaxial growth process. From this, it can be seen that the low emission efficiency (i.e., high EPD) at a carrier concentration lower than the optimum carrier concentration in the buffer layer, as in FIG. 5, is caused by the steep slope of the carrier concentration in the epitaxially grown buffer layer.

The reason why EPD becomes elevated when there is a large change in the buffer layer carrier concentration will now be explained. It is widely known in the field of metallurgy that the hardness of crystals varies depending on the type and concentration of the impurities (corresponding to dopants here) contained in the crystals. It is known that adding Si to GaP hardens the GaP crystal. However, while a gradual change in the Si concentration in epitaxially grown layers does not affect the crystallinity, a large change degrades the crystallinity and increases the surface EPD. This phenomenon is well known from the results of research into inclined layers in strained lattice systems. However, discontinuous change in impurity concentration at interfaces between epitaxial layers causes discontinuous change in the hardness of the GaP crystal, and thus has the effect of interrupting the propagation of crystal defects.

From the results above, it became clear that the cause of the decrease in EPD by the buffer layer is not the growth of the buffer layer, but the difference in carrier concentration at the interface with another epitaxially grown layer provided to add to the buffer layer, which by preventing the propagation of crystal defects from the substrate (or base epitaxial layer), decreases the EPD.

In view of this, it may seem that the EPD can be reduced by using a higher carrier concentration for the buffer layer, increasing the carrier concentration differential with the n-layer formed thereon. However, as mentioned above, an increase in carrier concentration is accompanied by a degradation in buffer layer crystallinity, reducing the electro-luminescence efficiency of the end-product light-emitting diode. In contrast with this, it would also seem possible to increase the carrier concentration differential at the interface between the substrate and buffer layer by decreasing the carrier concentration of the buffer layer. However, as explained with reference to FIG. 6, this would increase the size of the change in carrier concentration in the buffer layer, thereby increasing the EPD and lowering the electroluminescence efficiency. A further decrease in the carrier concentration in the vicinity of the interface between the substrate and the buffer layer will cause an increase in the electrical resistance in the region, resulting in the forward voltage of the light-emitting diode being elevated to an impractically high level.

The epitaxial structure for a GaP light-emitting diode according to the present invention was perfected based on a consideration of the above investigation items, and comprises an n-type GaP single crystal substrate on which are grown a plurality of n-type GaP layers constituting a buffer layer, in which the buffer layer has a lower etch pit density than the etch pit density of the single crystal substrate and the etch pit density of the buffer layer sequentially decreases from layer to layer, and a GaP active layer formed on the buffer layer.

More specifically, in regard to the plurality of buffer layers grown on the single crystal substrate, the problems described above are resolved and epitaxial crystal having a low EPD is obtained by growing a first buffer layer constituted by an n-type GaP layer approximately 100 μm thick that is grown using a carrier concentration at the start of growth of $(0.5 \text{ to } 3) \times 10^{17}$ cm$^{-3}$, and then growing on the first buffer layer a second buffer layer constituted by an n-type GaP layer approximately 100 μm thick that is grown using a carrier concentration at the start of formation of $(0.5 \text{ to } 6) \times 10^{17}$ cm$^{-3}$. By then growing a GaP light emitting structure on this epitaxial crystal, a high emission efficiency can be realized. In accordance with this invention, even if a commercial quality GaP single crystal substrate is used having an EPD of, for example, $7.6 \times 10^4$ cm$^{-2}$, an epitaxial substrate provided with a buffer layer that is affected little by crystal defects can be obtained by growing at least two buffer layers so that there is a sharp decrease in EPD in the vicinity of the surfaces thus formed. By then forming an active layer on this epitaxial substrate having a low EPD, a GaP light-emitting structure having a high emission efficiency can be realized.

The GaP substrate used for the purpose of this invention may be single crystal substrate of standard crystal quality having an n-type carrier concentration of $(0.5 \text{ to } 10) \times 10^{17}$ cm$^{-3}$ and an EPD of $(6 \text{ to } 10) \times 10^4$ cm$^{-2}$. As described, n-type GaP plural buffer layers are epitaxially grown on the GaP single crystal substrate. The epitaxial layer that forms the first buffer layer is given an initial carrier concentration of $(0.5 \text{ to } 6) \times 10^{17}$ cm$^{-3}$. Because the dopant employed to grow the layer is an n-type, Si is the easiest to use. With Si as the dopant, the carrier concentration gradually rises with the progress of the epitaxial growth process. At the start of the growth process the EPD is about the same as that of the substrate, around $(6 \text{ to } 10) \times 10^4$ cm$^{-2}$. However, as the epitaxial growth advances, the EPD decreases sharply, dropping to around $5 \times 10^4$ cm$^{-2}$ by the time the epitaxial layer has reached a thickness of 40 μm, and then remaining more or less the same. To ensure this low EPD, and taking into consideration the melt-back at the start of epitaxial formation of the second buffer layer, the first buffer layer needs to be not less than 50 μm thick, and preferably should be around 100 μm thick.

A second buffer layer is then grown on the first buffer layer of the GaP substrate. Using Si as the dopant, the melt used for the epitaxial formation of the second buffer layer is given an initial carrier concentration of $(0.5 \text{ to } 6) \times 10^{17}$ cm$^{-3}$, the same as that used for forming the first buffer layer. Carrier concentrations are set to produce a differential of $(0.5 \text{ to } 2) \times 10^{17}$ cm$^{-3}$ at the interface of the first and second buffer layers, to ensure that the EPD propagation is interrupted by carrier concentration discontinuity and the like, as described above. The defect propagation prevention effect will not be exhibited if the carrier concentration differential is $0.5 \times 10^{17}$ cm$^{-3}$ or smaller, while with a differential of $2 \times 10^{17}$ cm$^{-3}$ or more, it becomes difficult to maintain the carrier concentration of the second buffer layer within the proper range.

When the second buffer layer is thus grown, as described above, at the beginning of the growth process the EPD of the second buffer layer is about $5 \times 10^{17}$ cm$^{-2}$, about the same as that of the first buffer layer, and sharply decreases with the progress of the epitaxial growth, the EPD decreases sharply, dropping to around $2 \times 10^4$ cm$^{-2}$ by the time the epitaxial layer has reached a thickness of 40 μm, and remains more or less the same thereafter. The second buffer layer needs to be not less than 40 μm thick, and preferably should be not less than 60 μm thick. If the reduction in the EPD is not sufficient, a third buffer layer is formed on the second buffer layer.

Repeating this operation enables the growth of epitaxial layers with a gradually decreasing EPD. However, it is economically disadvantageous to increase the number of operations in an attempt to overcome a gradual decrease in the degree of EPD reduction.

Thus growing a buffer layer comprised of at least two layers makes it possible for an EPD of $(6 \text{ to } 10) \times 10^4$ cm$^{-2}$ at the GaP substrate to be decreased to $2 \times 10^4$ cm$^{-2}$ at the surface of the buffer layer, a reduction of from one-third to one-fifth. Forming an active layer structure on this low EPD crystal surface makes it possible to obtain a high electro-luminescence efficiency LED.

The same active layer structure as that used in ordinary GaP light-emitting diodes may be employed, and may be grown by another epitaxial growth process applied to the GaP epitaxial substrate on which the plural buffer layer has been grown. For a green LED, a GaP p-n junction may be formed using nitrogen doped in an n-type GaP layer, while for a red LED, oxygen and zinc are doped in a p-type layer. The p-n junction is formed on the buffer layer formed on the substrate, usually as part of a series of epitaxial growth procedures.

The sharp drop in EPD that occurs immediately following the start of the epitaxial formation process is utilized by forming the plural GaP buffer layer on the GaP single crystal substrate to obtain epitaxial crystal having a low EPD. The active layer is then formed on the buffer layer, resulting in a high electro-luminescence efficiency LED. In terms of carrier concentration of the plural buffer layer, the overall carrier concentration of these buffer layers is $(0.5 \text{ to } 5) \times 10^{17}$ cm$^{-3}$, about the same as a standard GaP substrate carrier concentration. This being the case, the forward voltage is not effective. Using an appropriate carrier concentration differential has the effect of discontinuously changing the hardness of the crystal, helping to decrease the EPD.

The invention will now be described with reference to an embodiment. An n-type GaP substrate was used having a carrier concentration of $2.6 \times 10^{17}$ cm$^{-3}$ and an EPD of $7.6 \times 10^4$ cm$^{-2}$. To form the first buffer layer, polycrystal GaP was saturated in Ga metal at 1000° C., and the temperature was raised to 1030° C. to form a melt to which 25 mg of Si per 1000 g of Ga metal was added. The melt was cooled to 1000° C. and was introduced onto the GaP substrate to start epitaxial growth. Growth took place in a hydrogen atmosphere at a cooling rate of 2.5° C./min. When the temperature reached 700° C. the melt was separated from the substrate, completing the epitaxial growth of the first buffer layer.

As in the case of the first buffer layer, the second buffer layer growth started with the preparation of a melt, which was heated to 1030° C., cooled to 1000° C. and introduced onto the substrate provided with the first buffer layer to start the epitaxial growth. The cooling rate and atmosphere were the same as in the case of the first buffer layer. When the temperature reached 700° C. the melt was separated from the substrate, completing the epitaxial growth of the second buffer layer.

Figure 1:
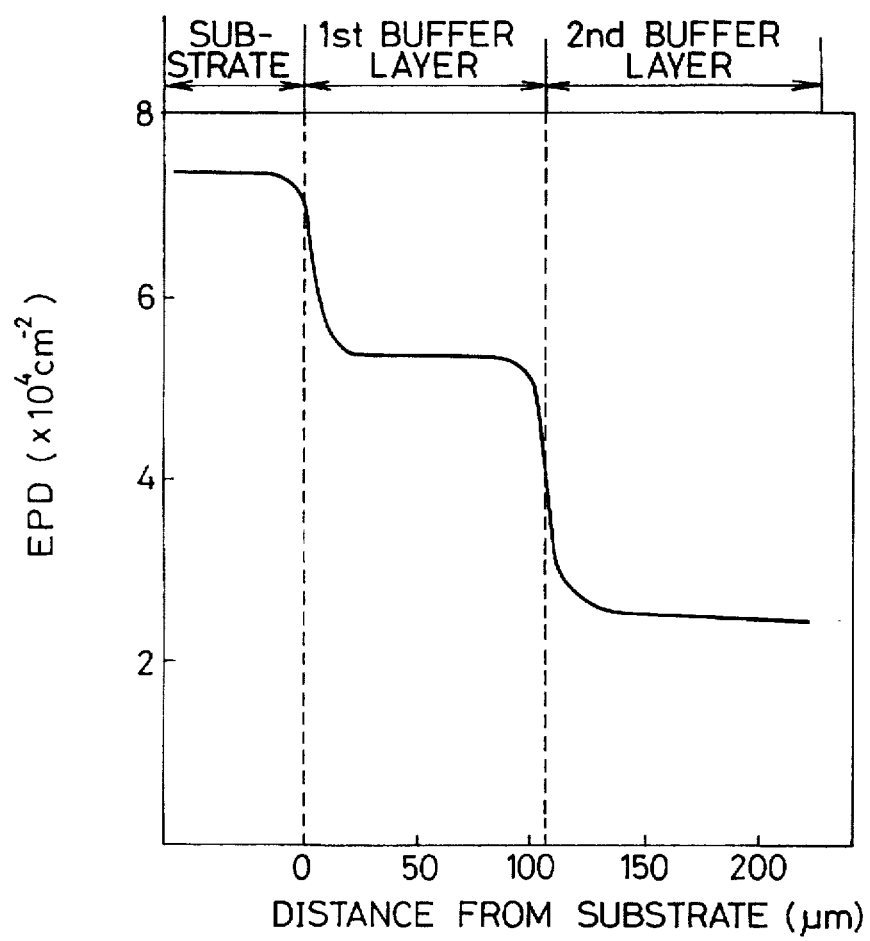
FIG. 1 shows an EPD profile of the substrate and buffer layer of the epitaxial structure for a GaP light-emitting diode according to the present invention.
Figure 2:
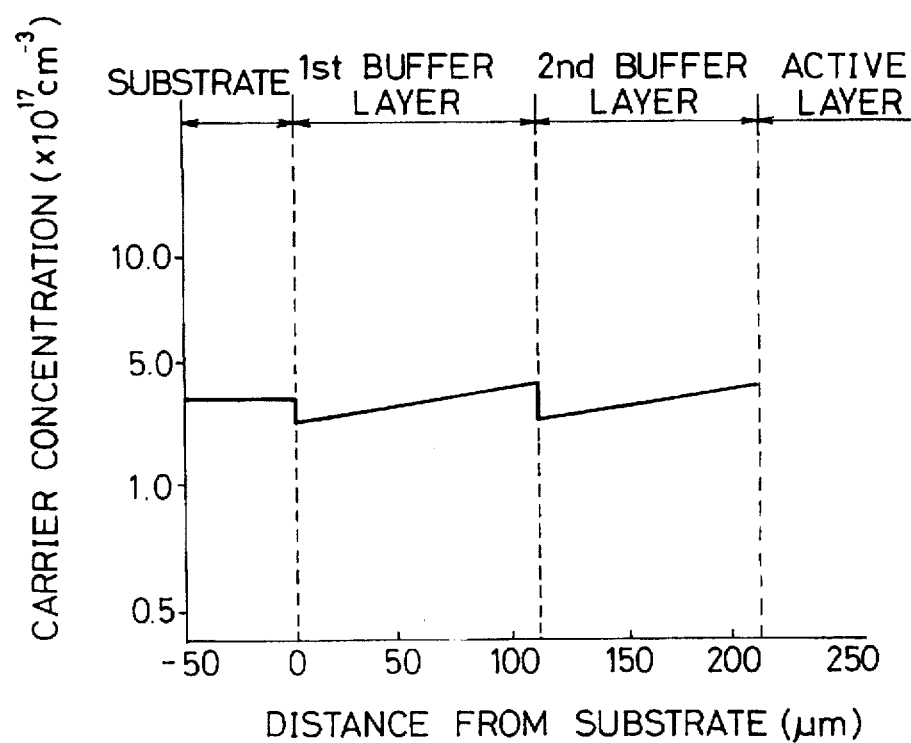
FIG. 2 shows a carrier concentration profile of the substrate and buffer layer of the epitaxial structure for a GaP light-emitting diode according to the present invention.

The above-described procedure was thus used to fabricate an epitaxial substrate comprising two Si-doped buffer layers on an n-type GaP substrate. The EPD profile of the epitaxial substrate thus grown, is as shown in FIG. 1. The EPD of the substrate was in the region of $7.6 \times 10^4$ cm$^{-2}$, that of the first buffer layer was around $5.5 \times 10^4$ cm$^{-2}$, and that of the second buffer layer was around $2.3 \times 10^4$ cm$^{-2}$. FIG. 2 is the carrier concentration profile of the substrate and buffer layers, showing that the carrier concentration of the GaP substrate was in the region of $4.0 \times 10^{17}$ cm$^{-3}$. The first buffer layer grown on the substrate was approximately 115 µm thick. The carrier concentration in the first buffer layer was $3 \times 10^{17}$ cm$^{-3}$ in the vicinity of the interface with the substrate, gradually increasing, to $4.5 \times 10^{17}$ cm$^{-3}$ in the vicinity of the surface of the first buffer layer. The carrier concentration in the second buffer layer was $3 \times 10^{17}$ cm$^{-3}$ in the vicinity of the interface with the first buffer layer, gradually increasing, to $4.5 \times 10^{17}$ cm$^{-3}$ in the vicinity of the surface of the second buffer layer. In the substrate provided with the buffer layer as described above, there is a sharp decrease in EPD across the interface with the substrate, and across the interface between the first and second buffer layers. It is revealed that at the surface of the second buffer layer, the EPD has declined to one-third or less of the level of EPD at the GaP substrate.

The method of growing the light emitting structure on the buffer layer formed on the single crystal substrate will now be described. Polycrystal GaP was added to Ga metal in an amount such that a melt to be framed is saturated at 800° C. and the temperature was raised to 1000° C. to form a melt. Keeping the temperature at 1000° C., the melt was introduced onto the substrate on which the buffer layer had been grown. At 1000° C. the melt is in an unsaturated state, so this caused a melt-back of the buffer layer on the substrate, whereby the melt was supplied with Si from the buffer layer. At this stage, saturated GaP metal containing Si was contacted with the substrate.

The growth system was then cooled at 2.5° C./min, starting epitaxial growth of an n-type GaP layer. When the temperature reached 960° C., ammonia gas was added to the growth system, producing the growth of a nitrogen-doped active layer. It is known that nitrogen produced by the decomposition of the ammonia gas is taken up by the GaP epitaxial layer, forming the emission core and by also trapping the Si in the melt, has the effect of reducing the carrier concentration in the active layer and increasing the electroluminescence efficiency.

When the formation temperature reaches 900° C., zinc vapor produced by introducing zinc metal to a vapor source (750° C.) is introduced into the growth system. This adds zinc to the melt, resulting in growth of a p-type GaP layer at and below 900° C. When the temperature reaches 700° C. the melt is separated from the substrate, terminating the epitaxial growth process. In this way, a zinc-doped p-type GaP layer is grown on an n-type GaP layer that includes nitrogen.

Figure 7:
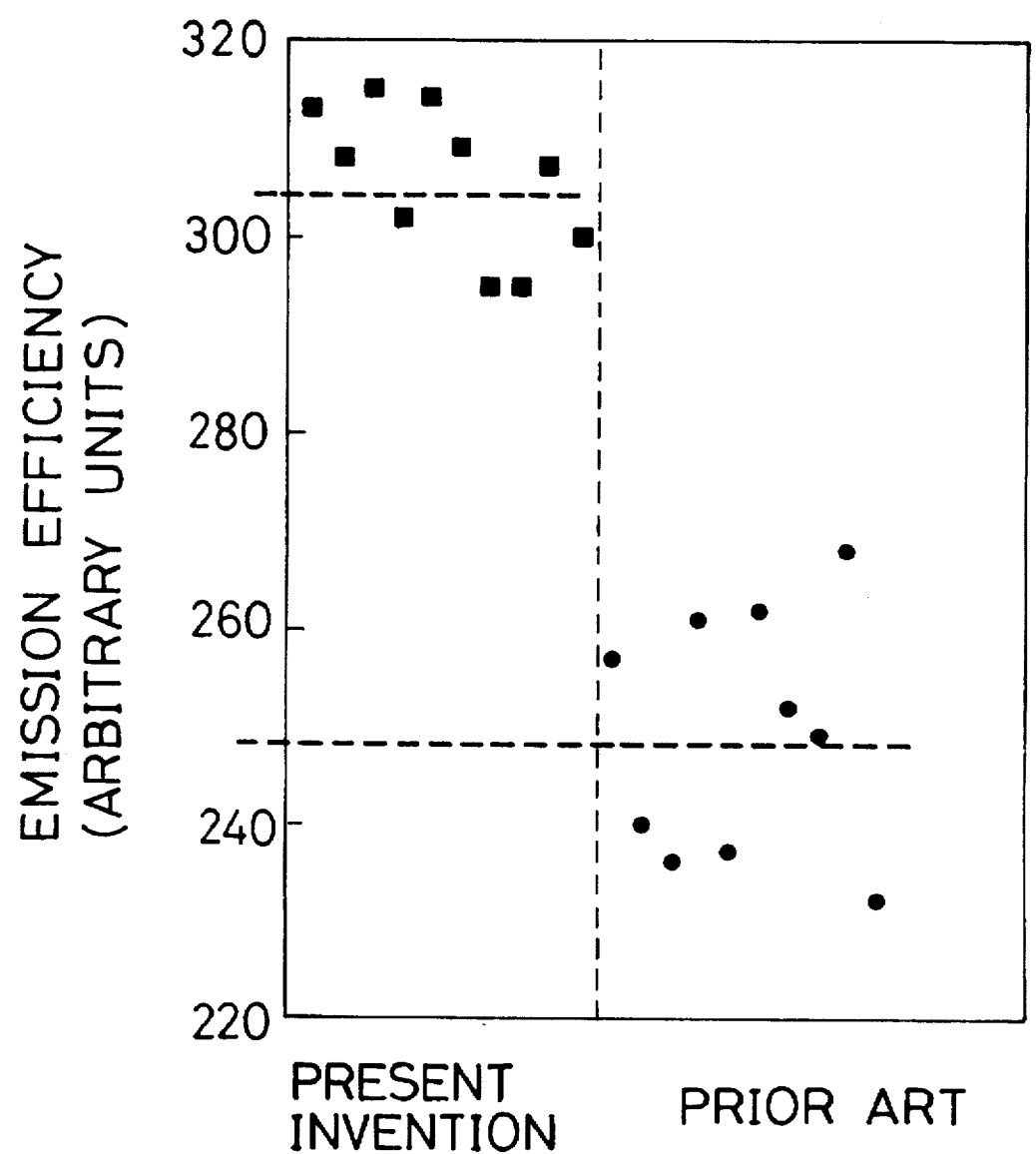
FIG. 7 shows the results of a comparison between the electro-luminescence efficiency of the light emitting structure of two-layer buffer structure substrates according to the prior art and according to the present invention.

FIG. 7 shows the emission efficiency of a GaP light-emitting diode thus fabricated compared to the emission efficiency of an LED fabricated by a conventional method. From FIG. 7, it can be seen that using a two-layer buffer structure improves the electroluminescence efficiency by around 20%, compared to a conventional light-emitting diode. By using a multiple buffer layer structure in accordance with this invention, it is possible to lower the EPD even when using a GaP substrate of only ordinary crystal quality. Therefore, it is possible to obtain good quality epitaxial crystal in an active layer grown on such a substrate, thereby achieving improved LED electro-luminescence efficiency. The present invention is particularly effective when applied to green LEDs, in which high electro-luminescence efficiency has hitherto been impossible to achieve. As such, the present invention has practical applicability to outdoor displays.

What is claimed is:

1. An epitaxial structure for a GaP light-emitting diode, comprising:

an n-conductivity type GaP single crystal substrate;

a plurality of n-conductivity type GaP layers epitaxially grown on the single crystal substrate to form at least first and second buffer layers in which each of said plurality of layers has a lower etch pit density than an etch pit density of the single crystal substrate and the etch pit density decreases monotonically with each upper layer; and a GaP active layer grown on the second buffer layer, wherein said first buffer layer has a thickness of at least 50 µm and said second buffer layer has a thickness of at least 40 µm, and wherein there is a carrier concentration differential of (0.5 to 2)$\times 10^{17}$ cm$^{-3}$ at an interface between said first buffer layer and said second buffer layer.

2. The epitaxial structure according to claim 1, wherein the first buffer layer has an etch pit density of (2 to 5)$\times 10^4$ cm$^{-2}$ and the second buffer layer has an etch pit density of (1 to 3)$\times 10^4$ cm$^{-2}$.

3. The epitaxial structure according to claim 1 or 2, wherein the first and second buffer layers each have a carrier concentration of (0.5 to 6)$\times 10^{17}$ cm$^{-3}$.

4. The epitaxial structure according to claim 1 or 2, wherein the carrier concentration of each of the first and second buffer layers increases going from the substrate towards the active layer.

5. The epitaxial structure according to claim 1 or 3, wherein a dopant in each of the first and second buffer layers is Si.

6. The epitaxial structure according to claim 1, wherein the decrease in etch pit density of each of said first and second buffer layers is greater as epitaxial growth increases up to a depth of 40 microns than the decrease in etch pit density at a depth greater than 40 microns.

* * * * *